US012777560B2

(12) United States Patent
Desmeules

(10) Patent No.: US 12,777,560 B2
(45) Date of Patent: Oct. 27, 2026

(54) PRESENCE DETECTION SYSTEM FOR HEATED WEARABLES

(71) Applicant: Brooke Erin DeSantis, Montreal (CA)

(72) Inventor: Alain Desmeules, Montreal (CA)

(73) Assignee: Brooke Desantis, Montreal (CA)

( * ) Notice: Subject to any disclaimer, the term of this patent is extended or adjusted under 35 U.S.C. 154(b) by 1073 days.

(21) Appl. No.: 17/882,688

(22) Filed: Aug. 8, 2022

(65) Prior Publication Data

US 2024/0049360 A1 Feb. 8, 2024

(51) Int. Cl.
*H05B 1/02* (2006.01)
*A41D 13/005* (2006.01)
(Continued)

(52) U.S. Cl.
CPC ....... *H05B 1/0272* (2013.01); *A41D 13/0051* (2013.01); *G01D 5/2405* (2013.01); *H03K 17/962* (2013.01)

(58) Field of Classification Search
CPC . H05B 1/0272; A41D 13/0051; H03K 17/962
See application file for complete search history.

(56) References Cited

U.S. PATENT DOCUMENTS 5,764,145 A * 6/1998 Hansson .............. H03K 17/955 340/567
10,201,195 B1 * 2/2019 Khaliuta .................. H05B 3/34
(Continued)

FOREIGN PATENT DOCUMENTS

CN 110113828 A * 8/2019 ............. H05B 3/342
JP 2020057537 A * 4/2020
WO WO-2022214423 A1 * 10/2022 ............... A41C 3/04

OTHER PUBLICATIONS

Translation of CN-110113828-A (Year: 2019).*
Translation of JP-2020057537-A (Year: 2020).*
WO-2022214423-A1 (Year: 2022).*

*Primary Examiner* — Elizabeth M Kerr
(74) *Attorney, Agent, or Firm* — Brouillette Legal Inc.; Robert Brouillette; Guy Houle

(57) ABSTRACT

A presence detection system for electrically heated wearables to safeguard against accidental battery drainage and the risk of heating elements of the wearables being accidently connected to power. The presence detection system is comprised of a capacitive touch sensor secured to an automatic switch actuation circuit. The capacitive touch sensor has an electronic circuit connected to a portable rechargeable battery supply of an associated heated wearable. The battery supply provides power to one or more heating elements secured to the heated wearable through a switch. The capacitive touch sensor is secured to the heated wearable at a position wherein a sensing face of the capacitive touch sensor can detect the presence of a wearer person. The electronic circuit generates an output signal to the automatic switch actuation circuit indicative of the presence of the wearer person. The heated wearable when removed from the wearer person, with the switch in a “closed” state continuing to supply power to the one or more heating elements and to the capacitive touch sensor, the automatic switch actuation circuit automatically actuates the switch to an “open” state to cut off the power supply.

9 Claims, 3 Drawing Sheets

(51) Int. Cl.
*G01D 5/24* (2006.01)
*H03K 17/96* (2006.01)

(56) References Cited

U.S. PATENT DOCUMENTS

| | | | | |
|---|---|---|---|---|
| 2004/0159109 | A1 * | 8/2004 | Harvie | A41D 13/0051 62/3.5 |
| 2007/0051610 | A1 * | 3/2007 | Weiss | H03K 17/962 200/600 |
| 2015/0230524 | A1 * | 8/2015 | Stevens | H05B 1/02 219/494 |
| 2017/0265810 | A1 * | 9/2017 | Van De Vyver | A01K 29/005 |
| 2017/0332442 | A1 * | 11/2017 | Strecker | H05B 1/0272 |
| 2018/0317572 | A1 * | 11/2018 | Guttman | A41D 27/28 |

* cited by examiner

PRESENCE DETECTION SYSTEM FOR HEATED WEARABLES

FIELD OF THE INVENTION

The present invention relates to a presence detection system for electrically heated wearables to provide a safeguard against such wearables having their heating elements remaining connected to a battery supply, while not worn by a user person or accidently connected to battery supply, whereby to prevent heat damage and fire hazard from the heating elements as well as preventing battery drainage.

BACKGROUND OF THE INVENTION

Heated wearables having electrically heating wiring circuits are becoming more and more popular for use in climatic region where spring, winter and fall temperatures are cold can drop below the freezing point. Today, we find such electrically heated wearable in articles of clothing, gloves and boots and these are usually accompanied with a rechargeable battery which is stored in pockets of such articles or close to such articles, usually pockets of jackets or in removable storage cases which can be removably attached to the waist belt of a user person. Control devices are attached to heated articles of apparel and interface between the battery and the heating wiring circuits to provide various control functions of the heating circuits, such as controlling the intensity of the heat generated in relationship to the ambient temperatures. The control devices are equipped with a switch to connect and disconnect the battery supply from the heating elements as well as providing signalling LED's to give the user person with a visual indication of settings and the available power remaining in the battery.

These heating elements can pose a hazard in a situation where the user person forgets to switch off the battery supply from the heating elements after use of the heated wearable. For example, if the heated wearable is a vest or jacket and which after use the user person forgets to actuate the switch to disconnect the battery supply from the heating elements and the wearable is improperly stowed away, the fabric material becomes subject to the full heat of the heating elements as the body of the person is no longer in close contact to absorb most of this heat. This can cause the fabric of the wearable to heat to a temperature where the fabric could melt causing heat damage to the wearable and particularly so if the wearable is stowed with two heating elements in facial contact with one another. More seriously, and dependent on the type of material in contact with the heating elements, the heating elements could ignite the fabric causing serious fire damage. This is particularly so, if the heated wearable is stowed in a bag or suitcase where the article is compressed in a small package causing the heating elements being in very close or in contact with one another and the fabric material. Further, if the switch is accidentally switched "on" and the article is properly stowed, the battery will drain and rendering the heated wearable ineffective.

There is therefore a need to overcome these accidental problems with heated wearables incorporating electrically heated elements and portable rechargeable batteries.

SUMMARY OF THE INVENTION

It is therefore a feature of the present invention to overcome the above-mention problems with electrically heated wearables having rechargeable batteries to remove the risk of fire hazards or overheat damage in the form of burnt areas to the wearables caused by overheating in the absence of a wearer person as well as preventing accidental battery drainage rendering the wearable ineffective.

Another feature of the present invention is to provide a detection system secured to an electrically heated wearable which detects the absence of a wearer person and wherein the system automatically shuts off the battery supply after a predetermined time delay in the absence of the wearer person with the battery remaining connected to supply voltage to the heating elements.

Another feature of the present invention is to provide one or more capacitive touch sensors secured to an electrically heated wearable at locations in close proximity to a wearer person's body to detect the presence and absence of the wearer person's body by the use of electrical field sensing and wherein the wearable include heated articles of apparel, footwear, socks, cloves, heated insoles for shoes and boots, and any other heated article where the present invention is beneficial.

A further feature of the present invention is to provide one or more capacitive touch sensors mounted on a patch which can be attached at discrete locations in electrically heated wearables where it is not visible to the eye and comfortable to the wearer person to detect the presence of a person's body wearing the heated wearable.

Another feature of the present invention is to provide a safety patch for securement to electrically heated wearables to detect the presence of a wearer person and to trigger an alarm condition in the event the wearable is not occupied by a wearer person with the portable rechargeable battery remaining connected to heating elements whereby to prevent a fire hazard or other hazards.

A further feature of the present invention is to provide a presence detection system which prevents a portable rechargeable battery or battery pack associated with an electrically heated wearable to become drained by improper storage of the wearable or by accidental actuation of a switch connecting the battery supply to the heating elements.

According to the above features, from a broad aspect, the present invention provides a presence detection system for electrically heated wearables to safeguard against the risk of heating elements of the wearables being accidently connected to power. The presence detection system is comprised of a capacitive touch sensor secured to an automatic switch actuation circuit. The capacitive touch sensor has an electronic circuit connected to a portable rechargeable battery supply of an associated heated wearable. The battery supply provides power to one or more heating elements secured to the heated wearable through a switch. The capacitive touch sensor is secured to the heated wearable at a position wherein a sensing face of the capacitive touch sensor can detect the presence of a wearer person. The electronic circuit generates an output signal to the automatic switch actuation circuit indicative of the presence of the wearer person. The heated wearable when removed from the wearer person, with the switch in a "closed" state continuing to supply power to the one or more heating elements and to the capacitive touch sensor, the automatic switch actuation circuit automatically actuates the switch to an "open" state to cut off the power supply.

According to another broad aspect of the present invention, there is provided a safety patch for securement to electrically heated wearables. The safety patch has a capacitive touch sensor secured thereto with a sensing face of the capacitive sensor facing outwardly of the patch to be positioned in the direction of a wearer person's body when the patch is secured to a material layer of an electrically heated wearable. The capacitive touch sensor has an electronic circuit producing a continuous output signal connected to an automatic switch actuation circuit when detecting the wearer person's body and automatically actuates a power supply switch to an "open" state upon the automatic switch actuating circuit detecting the absence of the output signal to shut-off power supply.

BRIEF DESCRIPTION OF THE DRAWING

A preferred embodiment of the present invention will now be described with reference to the accompanying drawings in which.

DESCRIPTION OF THE PREFERRED EMBODIMENT

Before any embodiments of the application are explained in detail, it is to be understood that the application is not limited to the details of construction and the arrangement of component part set forth in the following description or illustrated by the following drawings. Further, it is to be understood that the phraseology and terminology used herein is for the purpose of description and should not be regarded as limiting but should encompass equivalents thereof.

Figure 1:
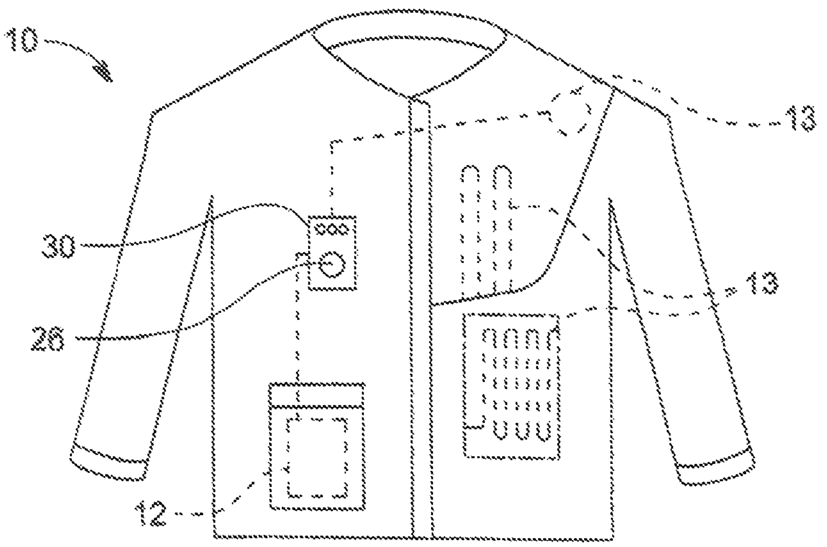
FIG. 1 is a schematic view, partly fragmented, illustrating a heated wearable in the form of a jacket article of apparel equipped with the presence detection system of the present invention which uses a capacitive touch sensor to sense the presence of a wearer person wearing the jacket and wired to send an output signal to an automatic switch actuation circuit associated with the control module secured to the jacket.

The present invention relates to a presence detection system for use in electrically heated wearables and wherein the system utilizes a capacitive touch sensor. Capacitive proximity sensors have many applications and is often referred to as "touch sensors" and a popular use is to trigger or switch power to devices "on" and "off", such as with lamps. These sensors are non-contact devices that can detect the presence or absence of virtually any object including liquid flows, etc. These devices act like a capacitor and use the electrical property of capacitance and the change of capacitance based on a change in the electrical field around the sensing face of the device when an object obstructs the electric field. FIG. 1, illustrates an electrically heated article of apparel 10 equipped with a capacitive touch sensor 11 mounted at a predetermined location, herein the shoulder area of the article of apparel, to detect the presence or absence of a wearer person's body when the jacket is worn and when a rechargeable battery or battery pack 12 is switched to a "closed" state by the control module 30 to supply voltage to the heating circuits 13 secured in the article of apparel. Of course, more than one capacitive touch sensor 11 may be installed in an article of apparel depending on its construction and intended use.

Figure 2:
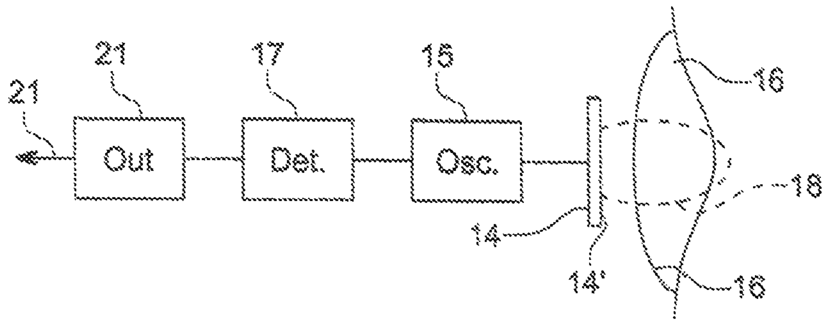
FIG. 2 is a simplified block diagram illustrating the basic component parts of a capacitive touch sensor.

As mentioned above, capacitive touch sensors are non-contact devices that can detect the presence or absence of objects positioned in the electric field that they generate. The basic parts of such devices are illustrated in FIG. 2. It comprises a flat metal plate 14 with its outer face 14' constituting a dielectric sensing face of the of the sensor wherein an electric field 18 is generated. The sensitivity, or sensing range, of the electric field is adjusted by a potentiometer 19, see FIG. 4B, mounted on its pcb board 20 located behind the metal plate 14. For the present application the potentiometer adjusts the field sensitivity to detect object in a range of up to 5 mm which has been found suitable for the application contemplated herein, but not limited thereto. The metal plate 14 is electrically connected to an internal oscillator circuit 15 which responds to the change in capacitance created between the sensing face 14' of the plate 14 and the surface of an object to be detected, herein the skin surface 16' of a person's body obstructing the electric field. The shoulder portion is a well-suited area, for a jacket as shown in FIG. 1, because such apparel drapes down from the shoulder area of a wearer person with the weight of the article of apparel applying a pulling load pressing the apparel fabric about the shoulder area. When the oscillator circuit 15 reaches a threshold level, when the shoulder of the wearer person is detected within its detection range, a trigger circuit 17 generates an output signal at an output connection 21 indicative of the presence of a wearer person.

Figure 3:
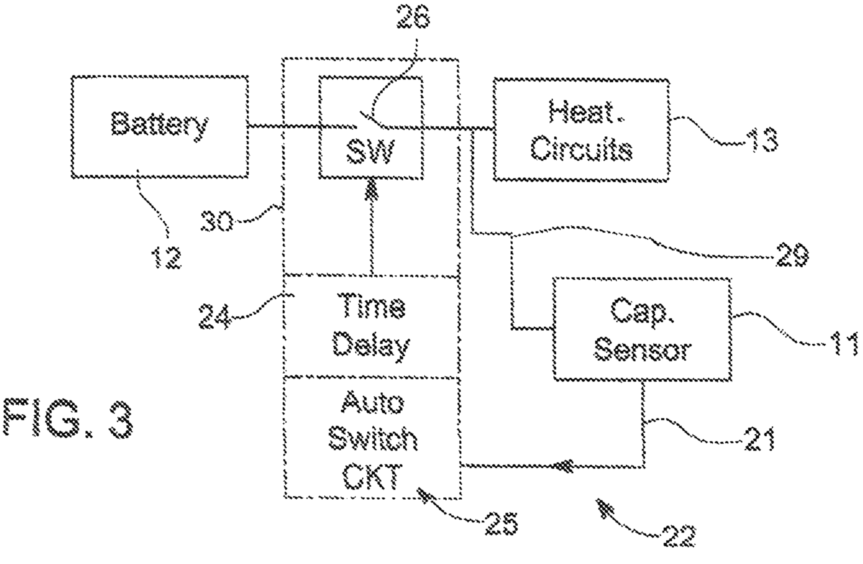
FIG. 3 is a block diagram of the presence detector system of the present invention incorporating a capacitive touch sensor.

The presence detection system 22 of the present invention is illustrated in FIG. 3 and was developed as a safeguard device for heated wearables to prevent such wearables from being stored away or simply left discarded with the battery accidently connected to the heating circuits of the wearable causing battery drainage and risk of excessive heat damage to the wearable and possible fire hazard. The term "electrically heated wearable" as utilized herein pertains to articles of apparel, footwear, socks, gloves, heated insoles for boots and shoes and any such articles to be in contact with a person's body and including any associated devices of such articles which provide heat from a portable battery. For example, an associated device could also be used to heat objects carried by an article of apparel, for example, a small heating pad could be mounted in a pocket of an article of apparel to heat golf balls positioned therein and the presence of golf balls would be detected by a capacitive touch sensor mounted in the pocket when the heating pad is in a state to generate heat.

Figure 4A:
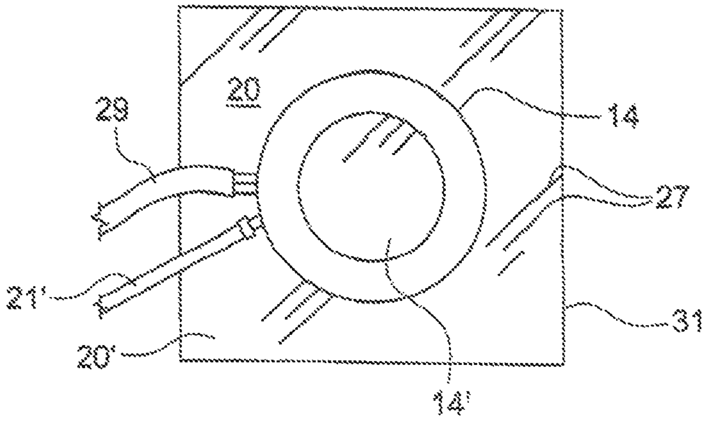
FIG. 4A is a simplified front view of the capacitive touch sensor showing its flat sensing face, herein in the form of a disc, and with the sensor secured on a fabric patch for attachment to a heated wearable and further with the patch impregnated with a waterproof substance.
Figure 4B:
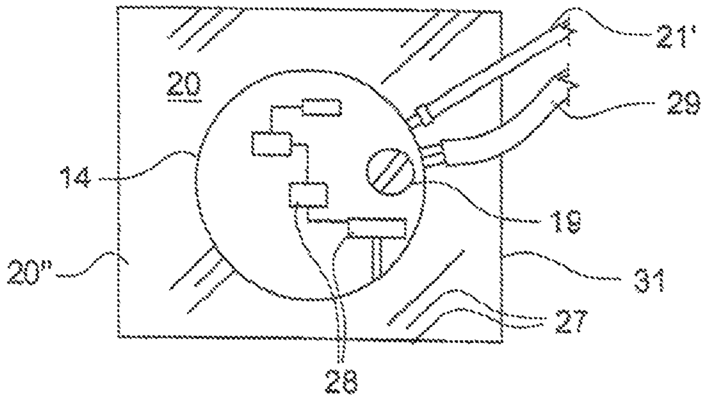
FIG. 4B is a simplified rear view of the pcb board on which the capacitive touch sensor is mounted and with the rear surface containing the electronic circuitry of the captive touch sensor and illustrating an adjustable potentiometer and input wire connections for supply voltage and an output signal conductive wire.

FIGS. 4A and 4B show the construction of the capacitive touch sensor 11 as utilized in the present application and secured to an attachable support patch 31. Other forms of support structures are also possible. As herein shown, the capacitive touch sensor 11 is in the form of a flat round disc, about the size of a ten cents piece, and mounted on a circuit board 20 with the sensing plate 14 lying on one side 20' of the circuit board 20 with its outer sensing surface 14' facing outwards. The other side 20" of the circuit board contains the electronic circuit components 28. A small diameter power cable 29 from the battery pack 12 connects wires to the input of the circuitry via a switch 26 mounted on the outer surface of the control module 30 which is easily accessible to the wearer person to connect the rechargeable battery 12 to the heating circuits 13. An example of such a control module is described in my co-pending U.S. patent application Ser. No. 17/581,891, filed on Jan. 22, 2022, and incorporated herein by reference. As also shown in FIGS. 4A and 4B, the attachment patch 31 is dimensioned to provide surrounding connecting areas suitable for stitching to attach the patch to a wearable. Alternatively, the patch can simply be glued to a wearable. The capacitive touch sensor is also entirely encapsulated in a silicon material 27 over the patch 30 to make it waterproof and with its wiring only exiting the encapsulated sensor. As mentioned above, the entire patch can be impregnated with a waterproof substance, such as silicon or the capacitive touch sensor only encapsulated.

As shown in FIG. 3, the presence detection system 22 includes the capacitive touch sensor 11 and wherein its output connection is connected to an automatic switch actuation circuit 25 which is associated with apart of the control module 30. The capacitive touch sensor 11 generates a constant output signal to the automatic switch actuation circuit 25 when detecting the presence of the body of the wearer person. When the wearer person operates the switch 26 to an "open" position, the battery 12 is disconnected from the heating circuits 13 and the capacitive touch sensor and the presence detection system is not engaged. However, in a situation where the output signal from the capacitive touch sensor 11 is no longer received by the automatic switch actuation circuit 25 which is still in an operative state receiving poser from the battery 12 and with the battery continuing to supply power to the heating circuits 13, the automatic switch actuation circuit will automatically actuate the switch to an "open" state to disconnect the power from the battery to the heating elements and shutting down the system preventing battery drainage and risk of damage to the article of apparel and the risk of accidental fire.

As herein shown, a time delay circuit 24 is provided wherein there is a pre-set delay of between 3 to 5 minutes before shutdown in the event the wearer person delays in switching the switch 26 "off". If the wearer person re-wears the garment within the time delay with the switch not having been actuated to an "off" state, the automatic switch actuation circuit 25 will automatically open the switch 26 after the time delay and the wearer person will have to actuate the switch again to connect the battery to the heating elements and the capacitive touch sensor is engaged. This automatic switch actuation circuit is a safeguard against accidental switch closures such as when packaging the heated wearable in a bag or suitcase wherein the wearable may be compressed to cause an accidental switch closure connecting the battery to the heating elements and creating a hazard and battery drainage.

Figure 5:
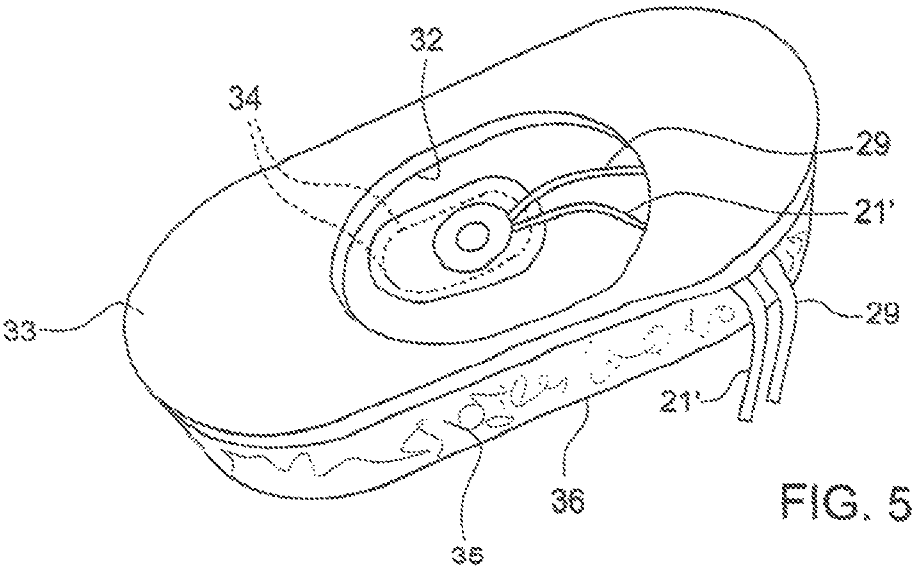
FIG. 5 is a fragmented view of fabric layers of an article of apparel showing the mounting of the capacitive touch sensor behind an inner liner material intended to lie against a wearer person's body.
Figure 6:
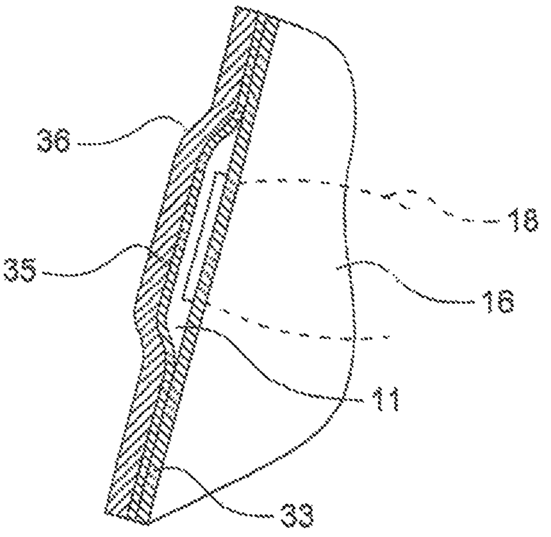
FIG. 6 is a cross-section view showing the position of the article of apparel on a wearer person's body and the electric field strength detecting the presence of the body of the wearer person.

As shown in FIGS. 5 and 6 the capacitive touch sensor, when applied to an article of apparel, is secured at a concealed location to an inner surface 32 of an inner lining fabric 33 of an article of apparel by thread stitches 34. An insulating fabric material 35 lies behind the inner lining fabric 33 and retained captive there behind by an outer fabric material 36. As shown in FIG. 6, the capacitive touch sensor 11 is retained in close proximity to a shoulder area of the wearer person's body which lies in its sensing range 18 of the sensor plate to detect the presence of the wearer person. When the article of apparel is removed from the wearer person's body and the person has placed the switch to an "open" position to disconnect the portable rechargeable battery 12 form its heating elements 13, the presence detection system is "off" which indicates that the battery is disconnected.

Figure 7A:
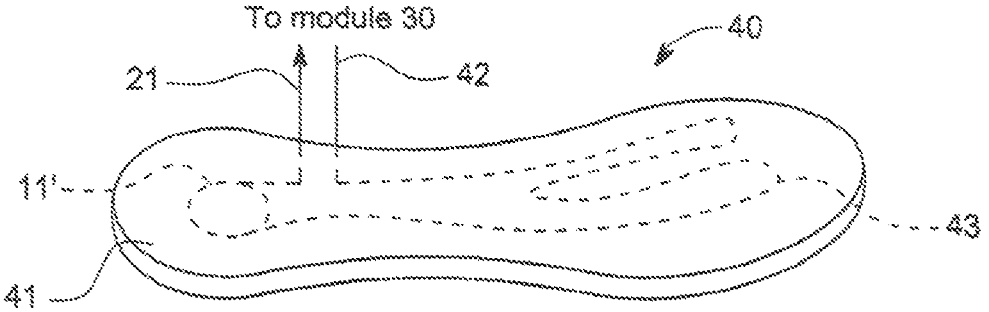
FIG. 7A is a perspective view of a heated insole for heating the feet of a wearer person and wherein a capacitive touch sensor is embedded into the insole to detect the foot of a wearer person.
Figure 7B:
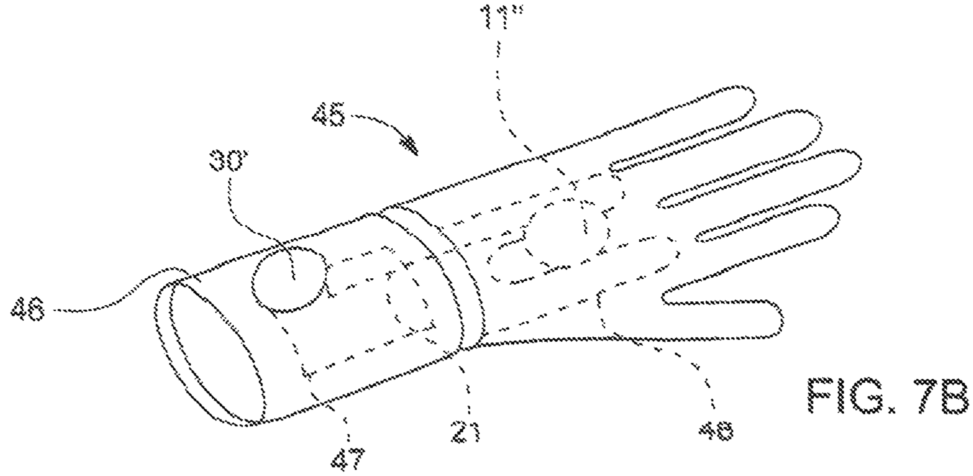
FIG. 7B is a perspective view of a heated glove incorporating the capacitive touch sensor and the automatic switch actuation circuit present in the control module attached to the glove.

Referring to FIGS. 7A and 7B, there is illustrated the presence detection system of the present invention as applied to different heated wearables, wherein in FIG. 7A, the capacitive touch sensor 11' is encapsulated into the heel portion 41 of an insole 40. The output signal from the capacitive touch sensor 11' is connected to an external control module, not shown, via its output connection 21' in a small diameter cable together with the battery supply wire connection 42 which supplies voltage to the insole heating wire circuit 43. FIG. 7B illustrates a heated glove 45 with the control module 30" secured to a wrist portion 46 of the glove 45 in which a supply battery 47 is retained in a concealed pocket to supply a heating wire 48'. A capacitive touch sensor 11" is concealed in to top of the glove with its sensor plate facing inwardly to detect a user person's hand when positioned in the glove. Output connection 21" connects the output signal from the capacitive touch sensor 11" to the automatic switch actuation circuit incorporated with the control module 30" to close the switch in the event of an alarm condition as described herein above. The capacitive touch sensor 11" may also form part of the control module 30 and be mounted thereunder with the sensor plate facing outwardly.

Many modifications and other embodiments of the present invention as described above will come to mind to a person skilled in the art to which the invention pertains having the benefit of the teachings described herein above and the drawings. Hence, it is to be understood that the embodiments of the present invention are not to be limited to the specific examples thereof as described herein and other embodiments are intended to be included within the scope of the present invention and the appended claims. Although the foregoing descriptions and associated drawings describe example embodiments in the context of certain examples of the elements and members and/or functions, it should be understood that different combinations of elements or substitutes and/or functions may be provided by different embodiments without departing from the scope of the present invention as defined by the appended claims. Furthermore, although specific terms are employed herein, they are used in a generic and descriptive sense only and other equivalent terms are contemplated herein with respect to the items that they relate to. It is therefore within the ambit of the resent invention to encompass all obvious modifications of the examples of the preferred embodiment described herein provide such modifications fall within the scope of the appended claims.

The invention claimed is:

1. A presence detection system for electrically heated wearables to safeguard against the risk of heating elements of said wearables being accidently connected to power, said presence detection system comprising a capacitive touch sensor secured to an automatic switch actuation circuit, said capacitive touch sensor having an electronic circuit connected to a portable rechargeable battery supply of an associated heated wearable, said battery supply providing power to one or more heating elements secured to said heated wearable through a switch, said capacitive touch sensor being secured to said heated wearable at a position wherein a sensing face of said capacitive touch sensor can detect the presence of a wearer person, said electronic circuit generating an output signal to said automatic switch actuation circuit indicative of the presence of said wearer person; said heated wearable, when removed from said wearer person with said switch in a "closed" state and continuing to supply power to said one or more heating elements and to said capacitive touch sensor, said automatic switch actuation circuit, upon detecting said switch in a closed state with said heated wearable removed from said wearer person, will automatically actuate the switch to an "open" state to cut off the power supply, and wherein said capacitive touch sensor is a flat disc secured to a support patch encapsulated in a silicone substance, said sensing face generating an electric field of predetermined strength, said support patch being secured to said article of apparel with said sensing face facing inwards of said article of apparel wherein said electric field will detect the presence of said wearer person's body through an inner liner fabric at a concealed location.

2. The presence detection system as claimed in claim 1 wherein said automatic switch actuation circuit is provided with a time delay circuit to automatically actuate said switch to said "open" state after a pre-set time delay period.

3. The presence detection system as claimed in claim 2 wherein said pre-set time delay period is within the range of 3 to 5 minutes.

4. The presence detection system as claimed in claim 1 wherein said electronic circuit of said capacitive touch sensor is provided with a potentiometer for adjusting the sensitivity/strength of said electric field up to a distance of about 5 mm.

5. The presence detection system as claimed in claim 1 wherein there are one or more of said capacitive sensors secured to said article of apparel at different locations of said article of apparel.

6. The presence detection system as claimed in claim 1 wherein said capacitive touch sensor has a flat dielectric sensing face, said electronic circuit having an oscillator circuit to produce said output signal indicative of the presence of said wearer person.

7. The presence detection system as claimed in claim 1 wherein said capacitive touch sensor electronic circuit is provided with a time delay circuit, said automatic switch actuation circuit automatically activating said switch to said "open" state, if said switch is accidently placed in a "closed" state supplying power to said heating elements and said automatic switch actuation circuit in the absence of said wearer person's body to prevent battery drainage and overheating and fire hazard to said article of apparel caused by said heating elements.

8. The presence detection system as claimed in claim 1 wherein said capacitive touch sensor electronic circuit has an oscillator circuit producing said continuous output signal.

9. The presence detection system as claimed in claim 1 wherein said electrically heated wearables comprise articles of apparel, shoes and boots, socks, gloves, heated insoles for boots and shoes.

* * * * *